(12) United States Patent
Chang

(10) Patent No.: US 11,992,914 B2
(45) Date of Patent: May 28, 2024

(54) POLISHING COMPOSITION, POLISHING METHOD, AND METHOD FOR PRODUCING SUBSTRATE

(71) Applicant: FUJIMI INCORPORATED, Aichi (JP)

(72) Inventor: I-Chun Chang, Miaoli County (TW)

(73) Assignee: FUJIMI INCORPORATED, Aichi (JP)

( * ) Notice: Subject to any disclaimer, the term of this patent is extended or adjusted under 35 U.S.C. 154(b) by 207 days.

(21) Appl. No.: 17/434,904

(22) PCT Filed: Mar. 24, 2020

(86) PCT No.: PCT/JP2020/013088
§ 371 (c)(1),
(2) Date: Aug. 30, 2021

(87) PCT Pub. No.: WO2020/196542
PCT Pub. Date: Oct. 1, 2020

(65) Prior Publication Data
US 2022/0055180 A1   Feb. 24, 2022

(30) Foreign Application Priority Data
Mar. 27, 2019   (JP) .................... 2019-061636

(51) Int. Cl.
*B24B 37/04*   (2012.01)
*H01L 21/3105*   (2006.01)
(Continued)

(52) U.S. Cl.
CPC ...... *B24B 37/044* (2013.01); *H01L 21/31053* (2013.01); *H01L 21/3212* (2013.01); *H01L 21/76819* (2013.01); *H01L 21/7684* (2013.01)

(58) Field of Classification Search
None
See application file for complete search history.

(56) References Cited

U.S. PATENT DOCUMENTS

2008/0132156 A1   6/2008   Yamato et al.
2015/0376462 A1   12/2015   Fu et al.
(Continued)

FOREIGN PATENT DOCUMENTS

CN   106661430 A   5/2017
JP   2006-026885 A   2/2006
(Continued)

OTHER PUBLICATIONS

JP 2018012752 A (translation) (Year: 2018).*
(Continued)

*Primary Examiner* — Roberts P Culbert
(74) *Attorney, Agent, or Firm* — Katten Muchin Rosenman LLP

(57) ABSTRACT

An object of the present invention is to provide a polishing composition which can make the removal rate of a metal material and the removal rate of a resin material the same or close to each other in a chemical mechanical polishing process, which can accordingly avoid or suppress the occurrence of a step difference. The polishing composition contains: abrasive grains containing silica, with at least a part of hydrogen atoms constituting a silanol group located on a surface of the silica being substituted with a cation of at least one metal atom M selected from the group consisting of aluminum, chromium, titanium, zirconium, iron, zinc, tin, scandium, and gallium; and a dispersing medium. The pH of the polishing composition is more than 2 and 7 or less.

13 Claims, 3 Drawing Sheets

(51) Int. Cl.
*H01L 21/321* (2006.01)
*H01L 21/768* (2006.01)

(56) References Cited

U.S. PATENT DOCUMENTS

2019/0077993 A1  3/2019  Park et al.
2019/0085209 A1  3/2019  Dockery et al.

FOREIGN PATENT DOCUMENTS

| | | |
|---|---|---|
| JP | 2007-150264 A1 | 6/2007 |
| JP | 2007-299942 A | 11/2007 |
| JP | 2014-022511 A | 2/2014 |
| JP | 2015-189898 A | 11/2015 |
| JP | 2017025295 A * | 2/2017 |
| JP | 2017-524767 A | 8/2017 |
| JP | 2018-012752 A | 1/2018 |
| JP | 2019-157120 A | 9/2019 |
| TW | 200535218 A | 3/1994 |
| WO | 2017/200297 A1 | 11/2017 |

OTHER PUBLICATIONS

JP 2017025295 A (translation) (Year: 2017).*
Office Action with mailing date of Jul. 26, 2023 from TW Patent application No. 109110215.
International Search Report and Written Opinion for PCT/JP2020/013088, with a mailing date of Jun. 23, 2020.
Notice of Reason for Refusal for JP Application 2021-509462, with a mailing date of Nov. 29, 2023.

* cited by examiner

POLISHING COMPOSITION, POLISHING METHOD, AND METHOD FOR PRODUCING SUBSTRATE

CROSS-REFERENCE TO RELATED APPLICATIONS

This application is a U.S. National Stage entry of International Application No. PCT/JP2020/013088 filed Mar. 24, 2020, which claims the benefit of JP Patent Application No. 2019-061636 filed Mar. 27, 2019, each of which is herein incorporated by reference in its entirety for all purposes.

TECHNICAL FIELD

The present invention relates to a polishing composition, a polishing method using the polishing composition, and a method for producing a substrate.

BACKGROUND ART

Usually, a flattening technique of increasing the flatness of the surface of a semiconductor substrate (for example, wafer) has been used in the semiconductor industry. Chemical mechanical polishing (CMP) is one of commonly used flattening techniques. The chemical mechanical polishing technique is a method for flattening the surface of an object to be polished (polished object) such as a semiconductor substrate using a polishing composition containing abrasive grains made of silica, alumina, or ceria or the like, an anticorrosion agent, and a surfactant and the like.

Furthermore, a substrate containing a resin material (sometimes abbreviated as "resin-containing substrate" in the present specification) has been also in widespread use. Therefore, the need for a polishing composition applied to polish the resin-containing substrate has been also gradually increasing.

Patent Literature 1 discloses a chemical mechanical polishing composition containing alumina, a complexing agent, and an oxidizing agent. The chemical mechanical polishing composition of Patent Literature 1 can be applied to subject a resin layer and a conductor layer to chemical mechanical polishing.

CITATION LIST

Patent Literatures

Patent Literature 1: Taiwan Patent Application No. 200535218 A1

SUMMARY OF INVENTION

Technical Problem

However, no polishing composition capable of polishing the resin-containing substrate at a high speed has existed. Therefore, an object of the present invention is to provide a polishing composition capable of polishing a resin-containing substrate at a high speed.

Solution to Problem

In order to achieve the above object, some embodiments of the present invention disclose a polishing composition containing: abrasive grains containing silica, with at least a part of hydrogen atoms constituting a silanol group located on a surface of the silica being substituted with a cation of at least one metal atom M selected from the group consisting of aluminum, chromium, titanium, zirconium, iron, zinc, tin, scandium, and gallium; a pH adjusting agent; and a dispersing medium, wherein a pH of the polishing composition is more than 2 and 7 or less.

Furthermore, another some embodiments of the present invention disclose a polishing method including a step of polishing an object to be polished using the polishing composition, wherein a surface of the object to be polished includes a patterned structure, and the patterned structure contains a resin material.

Still another some embodiments of the present invention disclose a method for producing a substrate, the method including the steps of: preparing a substrate, wherein a surface of the substrate includes a pattern structure, and the pattern structure contains a resin material; and polishing the substrate using the polishing composition.

Advantageous Effects of Invention

The present invention makes it possible to provide a polishing composition capable of polishing a resin-containing substrate at a high speed.

DESCRIPTION OF EMBODIMENTS

Figure 1:
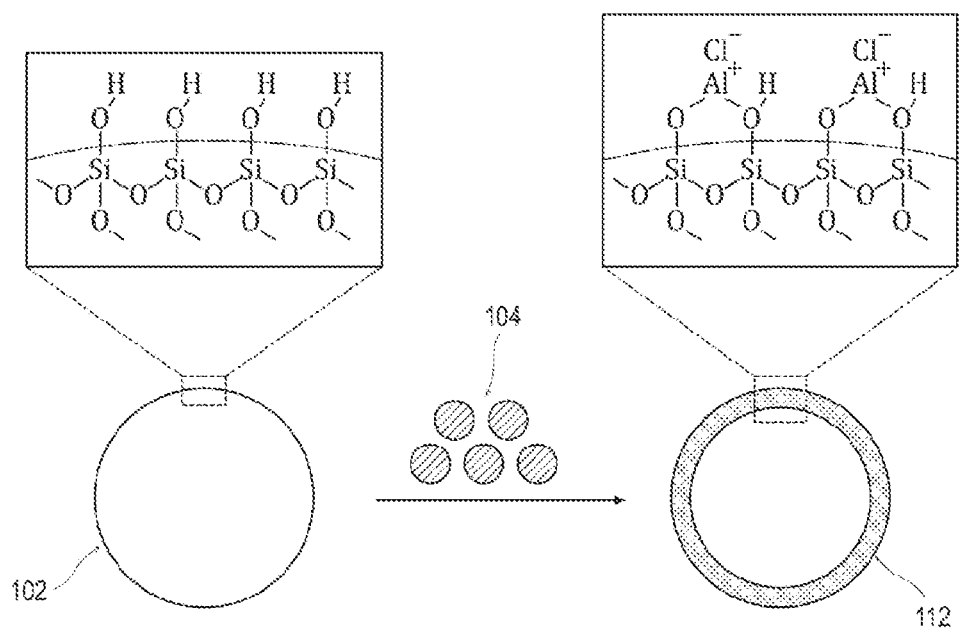
FIG. 1 is an illustration of a step of surface-modifying an abrasive grain according to some embodiments of the present invention.

In order that the above and other objects, features, and advantages of the present invention may be more clearly and easily understood, preferable embodiments will be exemplified and described in detail below.

Hereinafter, embodiments of the present invention will be described. The present invention is not limited to these embodiments.

An embodiment of the present invention is a polishing composition containing: abrasive grains containing silica, with at least a part of hydrogen atoms constituting a silanol group located on a surface of the silica being substituted with a cation of at least one metal atom M selected from the group consisting of aluminum, chromium, titanium, zirconium, iron, zinc, tin, scandium, and gallium; a pH adjusting agent; and a dispersing medium, wherein a pH of the polishing composition is more than 2 and 7 or less.

In the present embodiment, the polishing composition contains, as abrasive grains, colloidal silica whose surface instead of inside is modified with a specific metal cation. When an object to be polished including a patterned structure formed of a material containing a resin is polished using the polishing composition of the present embodiment, the removal rate (in the present specification, also referred to as polishing speed) of the resin material can be significantly increased.

However, an object to be polished applied to the polishing composition according to the present invention is not particularly limited, and any general semiconductor substrate can be applied. Examples of the object to be polished include silicon-containing substrates such as amorphous silicon, crystalline silicon, silicon oxide, and silicon nitride substrates. The polishing composition according to the present invention is particularly suitable for polishing a substrate including a patterned structure formed of a resin-containing material, and the technical effect of the present invention is fully exhibited when such a substrate is polished.

Specific examples of the resin material include polyethylene terephthalate (PET) (melting point: 260° C.) polybenzoxazole (PBO) (melting point: 200° C. or higher), polybutylene terephthalate (PBT) (melting point: 223° C.) polyimide (PI) (melting point: 200° C. or higher), polyamide (PA) (melting point: 187° C.), an epoxy resin (melting point: 200° C. or higher), a urethane acrylate resin (melting point: 200° C. or higher), an unsaturated polyester resin (melting point: 200° C. or higher), a phenol resin (melting point: 200° C. or higher), a polynorbornene resin, polyacetal (POM) (melting point: 175° C.), polycarbonate (PC) (melting point: 120° C.) modified polyphenylene ether (m-PPE) (melting point: 300° C. or higher), ultrahigh molecular weight polyethylene (UHMWPE) (melting point: 136° C.) syndiotactic polystyrene (SPS) (melting point: 270° C.) amorphous polyarylate (PAR) (melting point: 250° C.) polysulfone (PSF) (melting point: 185° C.) polyethersulfone (PES), polyphenylene sulfide (PPS) (melting point: 288° C.), polyetheretherketone (PEEK) (melting point: 343° C.), polyetherimide (PEI) (melting point: 217° C.), a fluororesin (melting point: about 200° C. or higher), and a liquid crystal polymer (LCP). Among these, a resin having a relatively high melting point is preferable, and a resin having a melting point of 200° C. or higher is preferable. The upper limit of the melting point of the resin is suitably 300° C. or lower.

Thus, polyethylene terephthalate (PET) (melting point: 260° C.), polybenzoxazole (PBO) (melting point: 200° C. or higher), polybutylene terephthalate (PBT) (melting point: 223° C.), polyimide (PI) (melting point: 200° C. or higher), an epoxy resin (melting point: 200° C. or higher), a urethane acrylate resin (melting point: 200° C. or higher), an unsaturated polyester resin (melting point: 200° C. or higher), a phenol resin (melting point: 200° C. or higher), modified polyphenylene ether (m-PPE) (melting point: 300° C. or higher), syndiotactic polystyrene (SPS) (melting point: 270° C.) amorphous polyarylate (PAR) (melting point: 250° C.) polyphenylene sulfide (PPS) (melting point: 288° C.) polyether ether ketone (PEEK) (melting point: 343° C.) polyetherimide (PEI) (melting point: 217° C.), and a fluororesin (melting point: about 200° C. or higher) are more preferable, and polyimide (PI), an epoxy resin, and a urethane acrylate resin are particularly preferable. Here, the method for measuring the melting point conforms to JIS K 0064: 1992 Methods for Measuring Melting Points and Melting Ranges of Chemical Products. A mechanism by which a desired effect of the present invention can be efficiently exhibited when the melting point is 200° C. or higher as described above is not clear. Therefore, according to an embodiment of the present invention, the melting point of the resin is 200° C. or higher. The resin materials can be used singly or in combination of two or more kinds thereof. According to an embodiment of the present invention, the resin contains a nitrogen atom. The resin contains the nitrogen atom, whereby the desired effect of the present invention can be efficiently exhibited. According to an embodiment of the present invention, a repeating unit constituting the resin contains a nitrogen atom. In such an embodiment, the desired effect of the present invention can be efficiently exhibited.

As described above, the polishing composition of the embodiment of the present invention is used for polishing an object to be polished containing a resin. According to an embodiment of the present invention, the application (use) of a polishing composition containing a specific abrasive grain to polishing of a resin material is provided.

According to an embodiment of the present invention, an object to be polished contains a metal material. Here, according to a general polishing composition, a removal rate of a metal material is higher than a removal rate of a resin material. That is, when a patterned structure containing a resin material and a metal material is polished, the removal rate of the metal material is different from the removal rate of the resin material, so that a step difference is apt to occur. According to the polishing composition of the present invention, a resin material whose polishing speed is generally low can be polished at a high speed. As a result, the removal rate of the metal material and the removal rate of the resin material can be made the same (that is, the removal rate of the resin material with respect to the removal rate of the metal material is set to 1.0) or close to each other (that is, the removal rate of the resin material with respect to the removal rate of the metal material is close to 1.0) in a chemical mechanical polishing process. Therefore, the occurrence of the step difference can be avoided or suppressed. According to an embodiment of the present invention, in order to make the removal rate of the resin material with respect to the removal rate of the metal material closer to 1.0, or for another purpose, at least one of a metal polishing accelerator, a metal anticorrosive, and an oxidizing agent may be contained in the polishing composition. The metal polishing accelerator, the metal anticorrosive, and the oxidizing agent will be described later.

As specific examples of the metal material, transition metals (in particular, Group 11) and metals of Group 13 are preferable, and examples thereof include copper, aluminum, cobalt, and tungsten. The metal materials can be used singly or in combination of two or more kinds thereof.

Hereinafter, various components contained in the polishing composition according to the present embodiment will be described.

[Abrasive Grain]

The polishing composition of the present embodiment contains silica as abrasive grains. In some embodiments, the abrasive grains are made of colloidal silica. The abrasive grain in the present embodiment is surface-modified with a specific metal cation. More specifically, the abrasive grains contain colloidal silica, with at least a part of hydrogen atoms constituting a silanol group located on a surface of the silica being substituted with a cation of a metal atom M. The metal atom M is at least one selected from the group consisting of aluminum, chromium, titanium, zirconium, iron, zinc, tin, scandium, and gallium.

Since general colloidal silica has a zeta potential close to zero under acidic conditions, electrostatic repulsion does not occur between colloidal silica particles under the acidic conditions, so that the aggregation of the particles is apt to occur. In the present embodiment, the colloidal silica particles are surface-modified, whereby the colloidal silica particles have a relatively large positive zeta potential (for example, more than 40 mV; the upper limit of the zeta potential is about 100 mV) under acidic conditions. Accordingly, the abrasive grains strongly repel each other under acidic or neutral conditions, whereby the abrasive grains are satisfactorily dispersed. As a result, the storage stability of the polishing composition is enhanced. The surface-modified silica of the present invention can be produced by a method disclosed in JP S47-26959 B. Alternatively, the surface-modified silica of the present invention can be produced by a method described in Examples.

In an embodiment of the present invention, the zeta potential of the abrasive grains in the polishing composition is preferably 20 mV or more, more preferably 25 mV or more, and still more preferably 30 mV or more. In an embodiment of the present invention, the zeta potential of the abrasive grains in the polishing composition may be 80 mV or less, 70 mV or less, 60 mV or less, 50 mV or less, or 40 mV or less.

The step of surface-modifying the abrasive grains may mainly include the steps of: mixing a salt compound of a metal atom M such as aluminum, chromium, titanium, zirconium, iron, zinc, tin, scandium, and gallium with colloidal silica particles; and substituting at least a part of hydrogen atoms constituting a silanol group located on a surface of colloidal silica with a cation of the metal atom M. Examples of the salt compound of the metal atom M include halides, hydroxides, sulfates, and nitrates of the metal atom M. Specific examples of the salt compound of the metal atom M include aluminum chloride, aluminum bromide, aluminum iodide, aluminum hydroxide, aluminum sulfate, aluminum nitrate, chromium chloride, chromium bromide, chromium iodide, chromium hydroxide, chromium sulfate, chromium nitrate, titanium chloride, titanium bromide, titanium iodide, titanium hydroxide, titanium sulfate, titanium nitrate, zirconium chloride, zirconium bromide, zirconium iodide, zirconium hydroxide, zirconium sulfate, zirconium nitrate, iron chloride, iron bromide, iron iodide, iron hydroxide, iron sulfate, iron nitrate, zinc chloride, zinc bromide, zinc iodide, zinc hydroxide, zinc sulfate, zinc nitrate, tin chloride, tin bromide, tin iodide, tin hydroxide, tin sulfate, tin nitrate, scandium chloride, scandium bromide, scandium iodide, scandium hydroxide, scandium sulfate, scandium nitrate, gallium chloride, gallium bromide, gallium iodide, gallium hydroxide, gallium sulfate, and gallium nitrate and the like. The salt compounds of the metal atoms M can be used singly or in combination of two or more kinds thereof.

In an embodiment of the present invention, in order to surface-modify the abrasive grains, it is preferable to add 0.0001 to 0.0010 g, more preferably 0.0002 to 0.0008 g, and still more preferably 0.0003 to 0.0006 g of the salt compound of the metal atom M with respect to 1 $m^2$ of the abrasive grains into a dispersion liquid in which the abrasive grains are dispersed.

The present inventors infer the mechanism of surface-modifying an abrasive grain with a specific metal cation in the present embodiment as follows. Note that the mechanism described below is based on the inference, and whether or not the mechanism is accurate does not affect the technical content and claims of the present invention. In the present specification, the mechanism of the surface modification will be described by taking as an example a case where colloidal silica is modified with aluminum ion.

FIG. 1 is an illustration of a step of surface-modifying an abrasive grain according to some embodiments of the present invention. See FIG. 1. The state of the surface of each of colloidal silica particles 102 dissolved (dispersed) in water is shown in an upper left square in FIG. 1. The main body of the colloidal silica particle 102 has a tetrahedral network structure composed of silica. One end of an oxygen atom located on the surface of the colloidal silica particle is bonded to a silicon atom, and the other end is bonded to a hydrogen atom to form a silanol group. The colloidal silica particle 102 is modified with an aluminum chloride modifier 104 to form a modified colloidal silica particle 112. The state of the surface of the modified colloidal silica particle 112 is as shown in an upper right square of FIG. 1. The main body of the modified colloidal silica particle 112 has a tetrahedral network structure similarly composed of silica, but a part of hydrogen atoms in a silanol group located on the surface of the colloidal silica particle are substituted with aluminum ions. As shown in FIG. 1, each aluminum ion is bonded to each of two oxygen atoms on the surface of the modified colloidal silica particle 112. Therefore, the surface of the modified colloidal silica particle 112 is positively charged, and negatively charged chlorine ions become counter ions.

In some embodiments, all hydrogen atoms in the silanol group located on the surface of the colloidal silica particle are substituted with aluminum ions. In such embodiments, the dispersibility of the colloidal silica particle is more excellent. In another embodiment, only a part of the hydrogen atoms in the silanol group located on the surface of the colloidal silica particle are substituted with aluminum ions.

Figure 2:
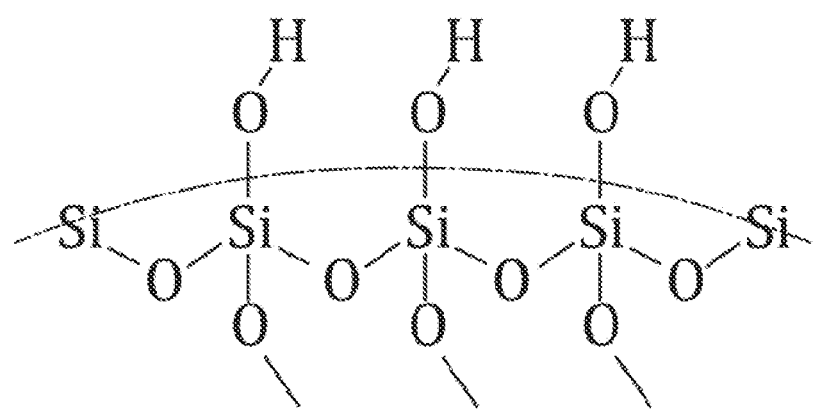
FIG. 2 is a schematic view of the surface of an unmodified silica abrasive grain.
Figure 3:
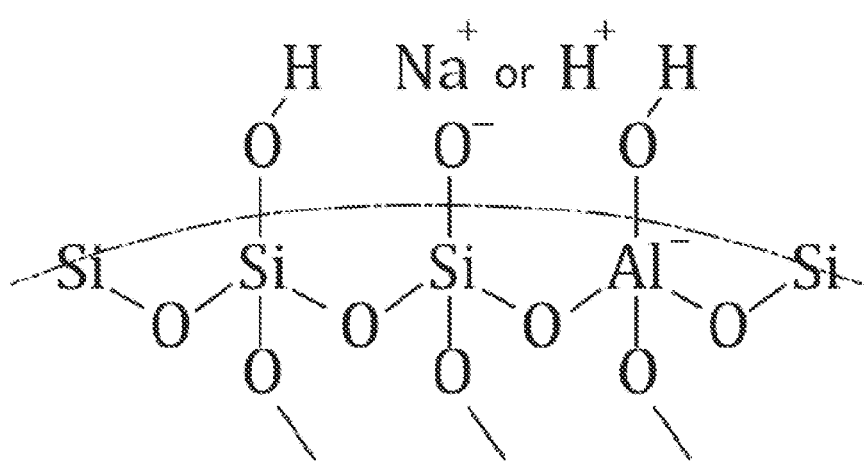
FIG. 3 is a schematic view of the surface of a silica abrasive grain showing that some silicon atoms are substituted with aluminum atoms.

When the colloidal silica particle is surface-modified using other metal ions having different valences, the number of oxygen atoms bonded to the metal atom M (or the cation of the metal atom M) may also be changed. In some embodiments, as shown in FIG. 1, the number of the oxygen atoms bonded to the metal atom M is 2. In some other embodiments, the number of the oxygen atoms bonded to the metal atom M is 1. In still some other embodiments, the number of the oxygen atoms bonded to the metal atom M is 3. In other words, one metal atom M is bonded to one oxygen atom of one silanol group; one metal atom M is bonded to two oxygen atoms of two silanol groups; or one metal atom M is bonded to three oxygen atoms of three silanol groups. For reference, FIG. 2 shows a schematic view of the surface of an unmodified silica abrasive grain. As described above, the surface of the unmodified silica abrasive grain is covered only with the silanol group. An abrasive grain to be recognized as being structurally distinguished from the specific abrasive grain of the present invention is shown in FIG. 3. FIG. 3 is a schematic view of the surface of a silica abrasive grain showing that a part of silicon atoms are substituted with aluminum atoms. In the abrasive grain of the present invention, at least a part of hydrogen atoms constituting a silanol group located on the surface of the silica are substituted with aluminum or the like. In contrast, in the abrasive grain of FIG. 3, silicon atoms located inside silica are substituted with aluminum atoms.

As the abrasive grain of the present invention, a synthetic product can be used, and a commercially available product can also be used. Examples of the commercially available product of the abrasive grains include Ludox (registered trademark) CL (manufactured by Sigma-Aldrich Co., Ltd.; aluminum ion-modified colloidal silica, counter ion: chlorine) and the like.

The content of the abrasive grains in the polishing composition is preferably 0.1% by weight or more, more preferably 0.5% by weight or more, and still more preferably 1% by weight or more based on 100% by weight of the total amount of the polishing composition. When the content of the abrasive grains is the above lower limit, the polishing speed of an object to be polished containing a resin material or a metal material is generally increased. Meanwhile, according to the embodiment of the present invention, the content of the abrasive grains in the polishing composition is more than 1% by weight (or 1.5% by weight or more). As described above, the abrasive grains surface-modified with the specific metal cation are used, and the content thereof is more than 1% by weight (or 1.5% by weight or more), whereby the polishing speed of the metal can be increased without the polishing speed of the resin being excessively increased. Therefore, the removal rate of the resin material with respect to the removal rate of the metal material is closer to 1.0.

The content of the abrasive grains in the polishing composition is preferably 10% by weight or less, more preferably 8% by weight or less, still more preferably 5% by weight or less, and particularly preferably 3% by weight or less based on 100% by weight of the total amount of the polishing composition. When the content of the abrasive grains is the above upper limit, and the object to be polished is polished using the polishing composition, a polished surface with less scratches can be easily obtained, and the aggregation of the abrasive grains is less likely to occur.

Therefore, according to an embodiment of the present invention, the content of the abrasive grains with respect to the total weight of the polishing composition is 0.1 to 10% by weight. According to such an embodiment, the polishing speed of an object to be polished containing a resin material or a metal material is increased, and a polished surface with less scratches can be easily obtained. In addition, the aggregation of the abrasive grains is less likely to occur.

The average primary particle size of the abrasive grains is preferably more than 30 nm, more preferably 40 nm or more, and particularly preferably 50 nm or more. As the average primary particle size of the abrasive grains increases, the polishing speed of an object to be polished containing a resin or a metal material increases. The specific surface area of the abrasive grains can be measured by the BET method, and the value of the average primary particle size of the abrasive grains can be calculated based on the measured specific surface area. The average primary particle size of the abrasive grains is preferably 150 nm or less, more preferably 130 nm or less, still more preferably 110 nm or less, yet still more preferably 90 nm or less, and most preferably 70 nm or less. As the average primary particle size of the abrasive grains decreases, a polished surface with less scratches can be easily obtained when the object to be polished is polished using the polishing composition.

Therefore, according to an embodiment of the present invention, the primary particle size of the abrasive grains is 40 to 150 nm. In such an embodiment, the polishing speed of an object to be polished containing a resin or a metal material can be increased, and a polished surface with less scratches can be easily obtained.

The average secondary particle size of the abrasive grains is preferably 60 nm or more, more preferably 80 nm or more, still more preferably 100 nm or more, and still more preferably 110 nm or more. As the average secondary particle size of the abrasive grains increases, the polishing speed of an object to be polished containing a resin or a metal material increases.

The average secondary particle size of the abrasive grains is preferably 300 nm or less, more preferably 250 nm or less, still more preferably 200 nm or less, yet still more preferably 150 nm or less, and particularly preferably 135 nm or less. As the average secondary particle size of the abrasive grains decreases, a polished surface with less scratches can be easily obtained when the object to be polished is polished using the polishing composition. The value of the average secondary particle size of the abrasive grains can be measured by a suitable method, for example, a laser light scattering method.

[pH Adjusting Agent]

The polishing composition of the present embodiment may contain a pH adjusting agent. From another viewpoint, a pH adjusting agent used for adjusting the pH value of the polishing composition to a range of more than 2 and 7 or less may be contained. The pH value of the polishing composition can be adjusted to a range of more than 2 and 7 or less by the pH adjusting agent. Examples of the pH adjusting agent include known acids or bases. When the pH of the polishing composition is 2.0 or less or more than 7.0, the polishing speed of the resin material is significantly reduced (comparison of Example 2 with Comparative Example 1, and comparison of Example 13 with Comparative Example 2). That is, the present invention is also characterized in that it is created by finding critical points related to the polishing speed of the resin material at pH 2.0 and pH 7.0.

The acid as the pH adjusting agent used in the polishing composition of the present embodiment may be an inorganic acid or an organic acid, or may be a chelating agent. Specific examples of the inorganic acid which can be used as the pH adjusting agent include hydrochloric acid (HCl), sulfuric acid ($H_2SO_4$), nitric acid ($HNO_3$), hydrofluoric acid (HF), boric acid ($H_3BO_3$), carbonic acid ($H_2CO_3$), hypophosphorous acid ($H_3PO_2$), phosphorous acid ($H_3PO_3$), and phosphoric acid ($H_3PO_4$). Among these inorganic acids, hydrochloric acid, sulfuric acid, nitric acid, and phosphoric acid are preferable.

Specific examples of the organic acid which can be used as the pH adjusting agent include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, hydroxyacetic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, glyoxylic acid, 2-furancarboxylic acid, 2,5-furandicarboxylic acid, 3-furancarboxylic acid, 2-tetrahydrofuran carboxylic acid, methoxyacetic acid, methoxyphenylacetic acid, and phenoxyacetic acid. Organic sulfuric acids such as methanesulfonic acid, ethanesulfonic acid, and 2-hydroxyethanesulfonic acid may be used. Among these organic acids, preferred are dicarboxylic acids such as malonic acid, succinic acid, glutaric acid, adipic acid, pimelic acid, maleic acid, phthalic acid, malic acid, and tartaric acid; and tricarboxylic acids such as citric acid.

In an embodiment of the present invention, the acid as the pH adjusting agent used in the polishing composition is different from the metal polishing accelerator. In an embodiment of the present invention, the acid as the pH adjusting agent used in the polishing composition does not contain an amino acid.

Examples of the base as the pH adjusting agent used in the polishing composition of the present embodiment include hydroxides or salts of alkali metals, hydroxides or salts of Group 2 elements, quaternary ammonium hydroxides or salts thereof, ammonia, and amines and the like. Specific examples of the alkali metal include potassium and sodium and the like.

When the polishing composition is alkaline (that is, the pH is more than 7), the zeta potential of the surface of the abrasive grains is shifted in a negative direction, so that repulsion with the resin material is weakened, which leads to a decrease in polishing speed of the resin material. Since the pH value of the polishing composition of the present embodiment is acidic or neutral, the polishing speed of the resin material can be effectively improved. More specifically, the upper limit value of the pH value of the polishing composition of the present embodiment is preferably less than 7, more preferably 6.5 or less, and still more preferably 6.2 or less. The upper limit value may be less than 6, 5 or less, or less than 5. When the pH value of the polishing composition is too low, it becomes difficult to effectively increase the removal rate of the resin material. When the pH value of the polishing composition is too low, the burden of a waste water treatment increases. The lower limit value of the pH value of the polishing composition of the present embodiment is more than 2, preferably 3 or more, more preferably more than 3, still more preferably 4 or more, yet still more preferably more than 4, even more preferably more than 5, even still more preferably 5.5 or more, and even yet still more preferably 5.8 or more. Since the pH value of the polishing composition of the present invention is acidic or neutral, the corrosion of the metal material can be suppressed, which can accordingly provide improved surface flatness and quality of the metal structure.

In an embodiment of the present invention, from the viewpoint of eliminating the step difference, the pH value is preferably 6.5 or less, more preferably 6.2 or less, still more preferably less than 6, yet still more preferably 5 or less, and even more preferably less than 5. In an embodiment of the present invention, from the viewpoint of eliminating the step difference, the pH value is more than 2, preferably 3 or more, more preferably more than 3, still more preferably 4 or more, and yet still more preferably more than 4.

[Dispersing Medium]

The polishing composition of the present embodiment contains a dispersing medium (may be referred to as "solvent"). The dispersing medium can be used to disperse or dissolve components in the polishing composition. In the present embodiment, the polishing composition may contain water as a dispersing medium. From the viewpoint of suppressing an inhibition of the action of other components, water containing as little impurity as possible is preferable. More specifically, pure water or ultrapure water from which foreign substances have been removed through a filter after removing impurity ions with an ion exchange resin, or distilled water is preferable.

[Oxidizing Agent]

The polishing composition used in the polishing method of the present invention may further contain an oxidizing agent as necessary. The kind of the oxidizing agent contained in the polishing composition is not particularly limited, but is preferably one having a standard electrode potential of 0.5 V or more. As compared to a case of using an oxidizing agent having a standard electrode potential of less than 0.5 V, the use of the oxidizing agent having a standard electrode potential of 0.5 V or more is useful for further increasing the polishing speed of the metal material portion performed using the polishing composition. Accordingly, the time required for the polishing process can be shortened, whereby the efficiency of the polishing process is increased. Specific examples of the oxidizing agent having a standard electrode potential of 0.5 V or more include hydrogen peroxide (1.7 V), sodium peroxide, barium peroxide, an organic oxidizing agent, ozone water, a salt of silver (II), a salt of iron (III) and permanganic acid, chromic acid, dichromic acid, peroxophosphoric acid, peroxoboric acid, performic acid, peracetic acid, perbenzoic acid, perphthalic acid, hypochlorous acid, hypobromous acid, hypoiodous acid, chloric acid, chlorous acid, perchloric acid, bromic acid, iodic acid, periodic acid (1.6 V), persulfuric acid (2.0 V), dichloroisocyanuric acid, trichloroisocyanuric acid, and salts thereof. These oxidizing agents may be used alone or as a mixture of two or more kinds thereof.

Among the above oxidizing agents, in consideration of effectively increasing the polishing speed of the metal portion by using the polishing composition, hydrogen peroxide, periodic acid or a salt thereof, persulfuric acid or a salt thereof, dichloroisocyanuric acid or a salt thereof, and trichloroisocyanuric acid or a salt thereof are preferable, and at least one selected from the group consisting of hydrogen peroxide, periodic acid and a salt thereof, and persulfuric acid and a salt thereof is particularly preferable.

The standard electrode potential refers to an electrode potential when all chemical species involved in an oxidation reaction are in the standard state, and is represented by the following Equation 1.

[Math 1]

$$E0 = -\Delta G0/nF = (RT/nF)\ln K \qquad \text{Equation 1}$$

In Equation 1, E0 is a standard electrode potential; $\Delta G0$ is a standard Gibbs energy change of an oxidation reaction; K is an equilibrium constant thereof; F is a Faraday constant; T is an absolute temperature; and n is the number of electrons involved in the oxidation reaction. As can be seen from Equation 1, since the standard electrode potential fluctuates with temperature, a standard electrode potential at 25° C. is employed in the present specification. The standard electrode potential of an aqueous solution system is described in, for example, Revised 4th Edition Chemical Handbook (basic edition) II, pp. 464 to 468 (edited by The Chemical Society of Japan).

When the polishing composition of the present embodiment contains the oxidizing agent, the content of the oxidizing agent is preferably 0.001% by weight or more, more preferably 0.01% by weight or more, and still more preferably 0.05% by weight or more based on 100% by weight of the total amount of the polishing composition. When the content of the oxidizing agent is the above lower limit, the polishing speed of the metal material portion by the polishing composition may be further increased.

When the polishing composition of the present embodiment contains the oxidizing agent, the content of the oxidizing agent is preferably 10% by weight or less, more preferably 5% by weight or less, still more preferably 1% by weight or less, and yet still more preferably 0.5% by weight or less based on 100% by weight of the total amount of the polishing composition. When the content of the oxidizing agent is the above upper limit, the excessive oxidation of the surface of the object to be polished by the polishing composition is less likely to occur, whereby a polished surface with less surface roughness can be obtained. In addition, the burden of the treatment of the polishing composition after polishing (that is, the burden of the waste water treatment) can also be reduced.

[Metal Polishing Accelerator]

The polishing composition of the present embodiment may further contain a metal polishing accelerator as necessary. The metal polishing accelerator is added into the polishing composition, which provides the following advantageous effect: the polishing speed of the metal material portion by the polishing composition is further increased by the etching action of the metal polishing accelerator. Accordingly, the time taken for the polishing process can be shortened, whereby the efficiency of the polishing process is improved.

As the metal polishing accelerator, for example, an inorganic acid, an organic acid, an amino acid, a nitrile compound, and a chelating agent and the like can be used.

Specific examples of the inorganic acid include sulfuric acid, nitric acid, boric acid, and carbonic acid and the like. Specific examples of the organic acid include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid and the like. Organic sulfuric acids such as methanesulfonic acid, ethanesulfonic acid, and isethionic acid can also be used. Instead of or in combination with the inorganic or the organic acid, salts such as an alkali metal salt of the inorganic or organic acid may be used.

Specific examples of the amino acid include glycine, α-alanine, β-alanine, N-methylglycine, N,N-dimethylglycine, 2-aminobutyric acid, norvaline, valine, leucine, norleucine, isoleucine, phenylalanine, proline, sarcosine, ornithine, lysine, taurine, serine, threonine, homoserine, tyrosine, bicine, tricin, 3,5-diiodo-tyrosine, β-(3,4-dihydroxyphenyl)-alanine, thyroxin, 4-hydroxy-proline, cysteine, methionine, ethionine, lanthionine, cystathionine, cystine, cysteic acid, aspartic acid, glutamic acid, S-(carboxymethyl)-cysteine, 4-aminobutyric acid, asparagine, glutamine, azaserine, arginine, canavanine, citrulline, δ-hydroxy-lysine, creatine, histidine, 1-methyl-histidine, 3-methyl-histidine, and tryptophan and the like. Among these, glycine, histidine, alanine, malic acid, tartaric acid, citric acid, glycolic acid, isethionic acid, or a salt thereof is preferable.

Specific examples of the nitrile compound include acetonitrile, aminoacetonitrile, propionitrile, butyronitrile, isobutyronitrile, benzonitrile, glutarodinitrile, and methoxyacetonitrile and the like. Specific examples of the chelating agent include nitrilotriacetic acid, diethylenetriaminepentaacetic acid, ethylenediaminetetraacetic acid, N,N,N-trimethylenephosphonic acid, ethylenediamine-N,N,N',N'-tetramethylenesulfonic acid, trans-cyclohexanediaminetetraacetic acid, 1,2-diaminopropanetetraacetic acid, glycol ether diamine tetraacetic acid, ethylenediamineorthohydroxyphenylacetic acid, ethylenediaminedisuccinic acid (SS-form), N-(2-carboxylate ethyl)-L-aspartic acid, β-alaninediacetic acid, 2-phosphonobutane-1,2,4-tricarboxylic acid, 1-hydroxyethylidene-1,1-diphosphonic acid, N,N'-bis(2-hydroxybenzyl) ethylenediamine-N,N'-diacetic acid, and 1,2-dihydroxybenzene-4,6-disulfone acid and the like.

The metal polishing accelerators can be used singly or in combination of two or more kinds thereof. Among the metal polishing accelerators, from the viewpoint of effectively increasing the polishing speed of the metal material portion by the polishing composition, an inorganic acid, an organic acid, or an amino acid is preferable; a carboxylic acid or an amino acid is more preferable; glycine or histidine is particularly preferable; and histidine is most preferable. Therefore, in an embodiment of the present invention, the metal polishing accelerator is at least one selected from the group consisting of a carboxylic acid and an amino acid. Such an embodiment provides the following technical effect: the metal can be easily dissolved to provide an increased polishing speed. According to an embodiment of the present invention, the number of nitrogen atoms of the amino acid is 3 or 4, or the amino acid has a heterocyclic ring. In such an embodiment, the desired effect of the present invention is efficiently exhibited. According to an embodiment of the present invention, the heterocyclic rings each independently one to three, one or two, or one nitrogen, oxygen, or sulfur atom.

When the polishing composition of the present embodiment contains the metal polishing accelerator, the content of the metal polishing accelerator in the polishing composition is preferably 0.01% by weight or more, more preferably 0.05% by weight or more, and particularly preferably 0.1% by weight or more based on 100% by weight of the total amount of the polishing composition. When the content of the metal polishing accelerator is the above lower limit, the polishing speed of the metal material portion of the polishing composition can be further increased.

When the polishing composition of the present embodiment contains the metal polishing accelerator, the content of the metal polishing accelerator in the polishing composition is preferably 10% by weight or less, more preferably 5% by weight or less, still more preferably 3% by weight or less, particularly preferably 1% by weight or less, and also preferably 0.4% by weight or less based on 100% by weight of the total amount of the polishing composition. When the content of the metal polishing accelerator is the above upper limit, the excessive etching of the metal material of the object to be polished can be avoided, and the burden of the waste water treatment after polishing can also be reduced. According to an embodiment of the present invention, the content of the metal polishing accelerator may be 0.3% by weight or less. According to such an embodiment, the polishing speed of the resin material can be further increased. According to an embodiment of the present invention, the content of the metal polishing accelerator may be more than 0.3% by mass. According to such an embodiment, the polishing speed of the metal material can be further increased.

[Metal Anticorrosive]

The polishing composition of the present embodiment may further contain a metal anticorrosive as necessary. By adding the metal anticorrosive into the polishing composition, it is possible to further suppress the occurrence of a recess on the side of the wiring by polishing using the polishing composition. Furthermore, the occurrence of the corrosion of the metal material can be suppressed or avoided, which can accordingly provide improved surface flatness and quality of the metal structure. When the object to be polished including a patterned structure formed of a resin and a metal material is polished, the surface flatness of the object to be polished can be improved, and the step difference formed on the surface of the object to be polished by polishing can be further reduced.

The metal anticorrosive which can be used is not particularly limited, but is preferably a heterocyclic compound or a surfactant. The number of members of the heterocyclic ring in the heterocyclic compound is not particularly limited. The heterocyclic compound may be a monocyclic compound or a polycyclic compound having a condensed ring. The metal anticorrosive may be used alone or as a mixture of two or more kinds thereof. As the metal anticorrosive, a commercially available product or a synthetic product may be used.

Specific examples of the heterocyclic compound which can be used as the metal anticorrosive include nitrogen-containing heterocyclic compounds such as a pyrrole compound, a pyrazole compound, an imidazole compound, a triazole compound, a tetrazole compound, a pyridine compound, a pyrazine compound, a pyridazine compound, a pyrindine compound, an indolizine compound, an indole compound, an isoindole compound, an indazole compound, a purine compound, a quinolizine compound, a quinoline compound, an isoquinoline compound, a naphthyridine compound, a phthalazine compound, a quinoxaline compound, a quinazoline compound, a cinnoline compound, a buteridin compound, a thiazole compound, an isothiazole compound, an oxazole compound, an isoxazole compound, and a furazan compound.

More specific examples of the pyrazole compound include 1H-pyrazole, 4-nitro-3-pyrazole carboxylic acid, 3,5-pyrazole carboxylic acid, 3-amino-5-phenylpyrazole, 5-amino-3-phenylpyrazole, 3,4,5-tribromopyrazole, 3-aminopyrazole, 3,5-dimethylpyrazole, 3,5-dimethyl-1-hydroxymethylpyrazole, 3-methylpyrazole, 1-methylpyrazole, 3-amino-5-methylpyrazole, 4-amino-pyrazolo[3,4-d]pyrimidine, allopurinol, 4-chloro-1H-pyrazolo[3,4-D]pyrimidine, 3,4-dihydroxy-6-methylpyrazolo(3,4-B)-pyridine, and 6-methyl-1H-pyrazolo[3,4-b]pyridin-3-amine and the like.

Examples of the imidazole compound include imidazole, 1-methylimidazole, 2-methylimidazole, 4-methylimidazole, 1,2-dimethylpyrazole, 2-ethyl-4-methyl imidazole, 2-isopropylimidazole, benzimidazole, 5,6-dimethylbenzimidazole, 2-aminobenzimidazole, 2-chlorobenzimidazole, 2-methylbenzimidazole, 2-(1-hydroxyethyl)benzimidazole, 2-hydroxybenzimidazole, 2-phenylbenzimidazole, 2,5-dimethylbenzimidazole, 5-methylbenzimidazole, 5-nitrobenzimidazole, and 1H-purine and the like.

Examples of the triazole compound include 1,2,3-triazole, 1,2,4-triazole, 1-methyl-1,2,4-triazole, methyl-1H-1,2,4-triazole-3-carboxylate, 1,2,4-triazole-3-carboxylic acid, 1,2,4-triazole-3-methyl carboxylate, 1H-1,2,4-triazole-3-thiol, 3,5-diamino-1H-1,2,4-triazole, 3-amino-1,2,4-triazole-5-thiol, 3-amino-1H-1,2,4-triazole, 3-amino-5-benzyl-4H-1,2,4-triazole, 3-amino-5-methyl-4H-1,2,4-triazole, 3-nitro-1,2,4-triazole, 3-bromo-5-nitro-1,2,4-triazole, 4-(1,2,4-triazole-1-yl)phenol, 4-amino-1,2,4-triazole, 4-amino-3,5-dipropyl-4H-1,2,4-triazole, 4-amino-3,5-dimethyl-4H-1,2,4-triazole, 4-amino-3,5-dipeptyl-4H-1,2,4-triazole, 5-methyl-1,2,4-triazole-3,4-diamine, 1H-benzotriazole, 1-hydroxybenzotriazole, 1-aminobenzotriazole, 1-carboxybenzotriazole, 5-chloro-1H-benzotriazole, 5-nitro-1H-benzotriazole, 5-carboxy-1H-benzotriazole, 5-methyl-1H-benzotriazole, 5,6-dimethyl-1H-benzotriazole, 1-(1',2'-di-carboxyethyl)benzotriazole, 1-[N,N-bis(hydroxyethyl)aminomethyl]benzotriazole, 1-[N,N-bis(hydroxyethyl)aminomethyl]-5-methylbenzotriazole, and 1-[N,N-bis(hydroxyethyl)aminomethyl]-4-methylbenzotriazole and the like.

Examples of the tetrazole compound include 1H-tetrazole, 5-methyltetrazole, 5-aminotetrazole, and 5-phenyltetrazole and the like.

Examples of the indazole compound include 1H-indazole, 5-amino-1H-indazole, 5-nitro-1H-indazole, 5-hydroxy-1H-indazole, 6-amino-1H-indazole, 6-nitro-1H-indazole, 6-hydroxy-1H-indazole, and 3-carboxy-5-methyl-1H-indazole and the like.

Examples of the indole compound include 1H-indole, 1-methyl-1H-indole, 2-methyl-1H-indole, 3-methyl-1H-indole, 4-methyl-1H-indole, 5-methyl-1H-indole, 6-methyl-1H-indole, 7-methyl-1H-indole, 4-amino-1H-indole, 5-amino-1H-indole, 6-amino-1H-indole, 7-amino-1H-indole, 4-hydroxy-1H-indole, 5-hydroxy-1H-indole, 6-hydroxy-1H-indole, 7-hydroxy-1H-indole, 4-methoxy-1H-indole, 5-methoxy-1H-indole, 6-methoxy-1H-indole, 7-methoxy-1H-indole, 4-chloro-1H-indole, 5-chloro-1H-indole, 6-chloro-1H-indole, 7-chloro-1H-indole, 4-carboxy-1H-indole, 5-carboxy-1H-indole, 6-carboxy-1H-indole, 7-carboxy-1H-indole, 4-nitro-1H-indole, 5-nitro-1H-indole, 6-nitro-1H-indole, 7-nitro-1H-indole, 4-nitrile-1H-indole, 5-nitrile-1H-indole, 6-nitrile-1H-indole, 7-nitrile-1H-indole, 2,5-dimethyl-1H-indole, 1,2-dimethyl-1H-indole, 1,3-dimethyl-1H-indole, 2,3-dimethyl-1H-indole, 5-amino-2,3-dimethyl-1H-indole, 7-ethyl-1H-indole, 5-(aminomethyl)indole, 2-methyl-5-amino-1H-indole, 3-hydroxymethyl-1H-indole, 6-isopropyl-1H-indole, and 5-chloro-2-methyl-1H-indole and the like.

Among these, the heterocyclic compound is preferably the triazole compound. Particularly, 1H-benzotriazole, 5-methyl-1H-benzotriazole, 5,6-dimethyl-1H-benzotriazole, 1-[N,N-bis(hydroxyethyl)aminomethyl]-5-methylbenzotriazole, 1-[N,N-bis(hydroxyethyl)aminomethyl]-4-methylbenzotriazole, 1,2,3-triazole, and 1,2,4-triazole are preferable. These heterocyclic compounds have a high chemical or physical adsorption force on the surface of the object to be polished, and therefore can form a stronger protective film on the surface of the object to be polished, which can accordingly effectively suppress the corrosion of the metal material. This is advantageous in improving the flatness of the surface of the object to be polished after the object to be polished is polished using the polishing composition of the present invention.

When the polishing composition of the present embodiment contains the metal anticorrosive, the content of the metal anticorrosive in the polishing composition is preferably 0.001% by weight or more, more preferably 0.005% by weight or more, and particularly preferably 0.01% by weight or more based on 100% by weight of the total amount of the polishing composition. When the content of the metal anticorrosive is the above lower limit, the corrosion of the metal material can be effectively suppressed.

When the polishing composition of the present embodiment contains the metal anticorrosive, the content of the metal anticorrosive in the polishing composition is preferably 5% by weight or less, more preferably 1% by weight or less, particularly preferably 0.5% by weight or less, and most preferably 0.1% by weight or less based on 100% by weight of the total amount of the polishing composition. When the content of the metal anticorrosive is the above upper limit, it is possible to avoid an excessive decrease in the polishing speed of the metal material of the object to be polished. Accordingly, the step difference formed on the surface of the object to be polished by polishing can be reduced. Furthermore, the burden of the waste water treatment after polishing can be reduced.

As described above, in an embodiment of the present invention, a polishing composition is preferable, which further contains an oxidizing agent having a standard electrode potential of 0.5 V or more as necessary, a metal polishing accelerator as necessary, and a metal anticorrosive as necessary. In such an embodiment, the desired effect of the present invention is efficiently exhibited. In an embodiment of the present invention, a polishing composition is provided, which further contains an oxidizing agent having a standard electrode potential of 0.5 V or more, a metal polishing accelerator, and at least one of a metal anticorrosive and an oxidizing agent.

[Other Components]

The polishing composition used in the polishing method of the present invention may further contain other components such as a chelating agent, a water-soluble polymer, an antiseptic agent, and an antifungal agent, as necessary.

[Polishing Method and Method for Producing Substrate]

As described above, the polishing composition according to the present invention is particularly suitable for polishing a substrate including a patterned structure formed of a resin material and a metal material. Therefore, the present invention provides a polishing method for polishing an object to be polished including a patterned structure formed of a resin material and, as necessary, a metal material with the polishing composition according to the present invention. For example, such an object to be polished may be a substrate including a patterned structure formed of polyimide and copper. The present invention provides a method for producing a substrate, including a step of polishing a substrate including a patterned structure formed of a resin and, as necessary, a metal material using the polishing composition according to the present invention. Such a substrate may include a patterned structure formed of, for example, polyimide and copper. When an object to be polished including a patterned structure formed of a resin material and a metal material is polished in order to effectively reduce a step difference which is formed in the surface of the object to be polished by polishing, the ratio of the removal rate of the resin material to the removal rate of the metal material is preferably closer to 1.0. More specifically, when an object to be polished including a patterned structure formed of a resin material and a metal material is polished at a specific polishing pressure (for example, 5 psi), the value of the ratio of the removal rate R1 of the resin material to the removal rate R2 of the metal material (R1/R2) is preferably closer to 1.0. In some embodiments, when the removal rate of the polishing composition with respect to the resin material when the polishing pressure is 5 psi is defined as a first removal rate R1, and the removal rate of the polishing composition with respect to the metal material is defined as a second removal rate R2, the value of the ratio of the first removal rate to the second removal rate (R1/R2) is 0.5 to 6.0. In some other embodiments, the value of the ratio of the first removal rate with respect to the second removal rate (R1/R2) is 0.5 to 4.0. In yet other embodiments, the value of the ratio of the first removal rate with respect to the second removal rate (R1/R2) is 0.8 to 3.0 (alternatively, 0.8 to 1.5).

As a polishing apparatus used in the polishing step, a polishing apparatus used in a general chemical mechanical polishing process can be used. The polishing apparatus includes a carrier for holding an object to be polished, a motor capable of changing the number of rotations, and the like, and a polishing table on which a polishing pad (or polishing cloth) can be attached.

The polishing pad is not particularly limited, and it is possible to use a general nonwoven fabric, a pad made of a polyurethane resin, and a pad made of a porous fluororesin, and the like. Furthermore, as necessary, the polishing pad can be grooved, which allows the polishing composition to be collected in the grooves of the polishing pad.

The parameter conditions of the polishing step are also not particularly limited, and adjustments can be made depending on actual needs. For example, the rotation speed of the polishing table can be set 10 to 500 rpm; the rotation speed of the carrier can be set 10 to 500 rpm; and the flow rate of the polishing composition can be set 10 to 500 ml/min. The method for supplying the polishing composition to the polishing pad is also not particularly limited, and, for example, a method of continuous supplying by a pump or the like can be employed.

After the completion of the polishing step, the object to be polished is washed in a water stream and dried by using a rotary dryer or the like to remove water droplets adhering to the object to be polished, thereby obtaining a substrate having a flat surface and no step difference.

EXAMPLES

Examples

The present invention will be described in more detail with reference to the following Examples and Comparative Examples, but the technical scope of the present invention is not limited only to the following Examples. In the present specification, unless otherwise specified, operations and measurements of physical properties and the like are performed under the conditions of room temperature (20 to 25° C.)/relative humidity 40 to 50% RH.

[Preparation of Polishing Composition]

According to the composition shown in Table 1 below, abrasive grains, a pH adjusting agent, a metal polishing accelerator, a metal anticorrosive, and an oxidizing agent were mixed in a dispersing medium (ultrapure water) (mixing temperature: about 25° C., mixing time: about 10 minutes) to prepare a polishing composition. As the abrasive grain shown in Table 1, a commercially available product can be used, or the abrasive grain can be obtained by adding a chemical product for surface-modifying (for example, aluminum chloride, APTES, and sulfonic acid, and the like; in the present Examples, aluminum chloride) to abrasive grains having unmodified surfaces. The pH of the polishing composition was confirmed using a pH meter (LAQUA manufactured by Horiba, Ltd.) (the temperature of the polishing composition at pH value measurement was 25° C.). Moreover, "-" in Table represents that the component is not added. The details of each component in Table 1 are as follows.

Abrasive grain A: Colloidal silica having a surface modified with aluminum ions (Primary particle size: 60 nm; Secondary particle size: 120 nm)

Abrasive grain B: Colloidal silica having an unmodified surface (Primary particle size: 30 nm; Secondary particle size: 60 nm)

Abrasive grain C: Abrasive grain obtained modifying the surface of the abrasive grain B with aminopropyltriethoxysilane (APTES) (Primary particle size: 30 nm; Secondary particle size: 60 nm; APTES modifier concentration: 1.3 M)

Abrasive grain D: Abrasive grain obtained by modifying the surface of the abrasive grain B with sulfonic acid (Primary particle size: 30 nm; Secondary particle size: 60 nm)

Abrasive grain E: Colloidal silica having an unmodified surface (Primary particle size: 60 nm; Secondary particle size: 120 nm)

Abrasive grain F: Abrasive grain obtained by modifying the surface of the abrasive grain E with aminopropyltriethoxysilane (Primary particle size: 60 nm; Secondary particle size: 120 nm; APTES modifier concentration: 1.3 M)

Abrasive grain G: Abrasive grain obtained by modifying the surface of the abrasive grain E with aminopropyltriethoxysilane (Primary particle size: 60 nm; Secondary particle size: 120 nm; APTES modifier concentration: 3.7 M)

Abrasive grain H: Abrasive grain obtained by modifying the surface of the abrasive grain E with aminopropyltriethoxysilane (Primary particle size: 60 nm; Secondary particle size: 120 nm; APTES modifier concentration: 5.0 M).

$H_2O_2$: hydrogen peroxide (concentration: 31%): standard electrode potential 1.7 V, hydrochloric acid: (concentration: 37%),
succinic acid: (purity: 99.9%),
Gly: glycine (purity: 100%),
L-His: L-histidine (purity: 98%),
BTA: benzotriazole; purity: 99.9%).

[Method for Producing Abrasive Grains A, C, D, and F to H]

Abrasive grain A: 1 L of a silica sol in which silica fine particles were dispersed at a silica concentration of 20% by mass (similar to the abrasive grain E) was maintained in a temperature range of 0 to 15° C., and 4.0 g of aluminum chloride was added to the silica sol while the silica sol was stirred or circulated.

Abrasive grain C: A colloidal silica dispersion containing 20% by mass of colloidal silica (which is the same the abrasive grain B) was prepared using pure water as a dispersing medium. Into 1 L of the colloidal silica dispersion, 1.3 mmol (3.7 mmol, 5.0 mmol) of (3-aminopropyl) triethoxysilane (APTES) was slowly (one drop every about 5 seconds, and about 0.03 g per drop) added. During the addition, the colloidal silica dispersion was stirred with a stirrer at a rate of 300 to 400 rpm. After the completion of the addition of APTES, stirring was continued at room temperature (25° C.) for 5 hours.

Abrasive grain D: A colloidal silica dispersion containing 20% by mass of colloidal silica (which is the same the abrasive grain B) was prepared using pure water as a dispersing medium. Into 1 L of the colloidal silica dispersion, 1.2 g of 3-mercaptopropyltrimethoxysilane as a silane coupling agent was added, and the resultant mixture was refluxed at a boiling point and heat-aged. Then, methanol and ammonia were substituted with water while pure water was added in order to keep the volume constant, and when the pH became 8 or less, the liquid temperature of the silica sol was once lowered to room temperature. Next, into the resultant silica sol, 10.7 g of 35% hydrogen peroxide water was added, and the resultant mixture was heated again. The reaction was continued for 8 hours, and the resultant mixture was cooled down to room temperature to obtain a sulfonic acid-modified aqueous anionic silica sol.

Abrasive grains F, G, H: A colloidal silica dispersion containing 20% by mass of colloidal silica (which is the same the abrasive grain E) was prepared using pure water as a dispersing medium. Into 1 L of the colloidal silica dispersion, 1.3 mmol (3.7 mmol, 5.0 mmol) of (3-aminopropyl) triethoxysilane (APTES) was slowly (one drop every about 5 seconds, and about 0.03 g per drop) added.

During the addition, the colloidal silica dispersion was stirred with a stirrer at a rate of 300 to 400 rpm. After the completion of the addition of APTES, stirring was continued at room temperature (25° C.) for 5 hours.

[Measurement of Surface Zeta Potential]

The surface zeta potential of the abrasive grains contained in the polishing composition was measured by a multiple frequency electro-acoustic method using an interface potential analyzer (Zeta Probe Analyzer manufactured by Colloidal Dynamics).

[Measurement of Removal Rate]

Polishing speeds were measured using the polishing composition obtained above when a polyimide substrate (manufactured by SVM: film thickness 50,000 Å) and a copper substrate (manufactured by SVM: film thickness: 40,000 Å) were polished under the following polishing conditions.

Polishing apparatus: Single-sided CMP polishing apparatus (FREX 300E: manufactured by Ebara Corporation)
Polishing pad: Pad made of polyurethane
Platen rotation speed: 110 rpm
Carrier rotation speed: 110 rpm
Flow rate of polishing composition: 300 mL/min
Polishing time: 60 sec
Polishing pressure: 2 psi (about 13.8 kPa) or 5 psi (34.5 kPa).

The thickness of the object to be polished before and after polishing was measured by an optical interference type film thickness measurement system (ASET-F5X manufactured by KLA-Tencor Corporation) for the polyimide substrate, and was measured by a sheet resistor (OmniMap RS-100 manufactured by KLA-Tencor Corporation) for the copper substrate. The removal rate was calculated by the following equation.

Removal rate={[[Thickness before polishing]−[Thickness after polishing]}/[Treatment time]

In the above equation, the unit of the thickness is Å; the unit of the treatment time is minute; and the unit of the removal rate is (Å/min).

[Calculation of Value of Ratio of Removal Rate]

A polishing step was performed at the above polishing pressure (that is, 2 psi or 5 psi), and a removal rate $R_{PI}$ of the polyimide substrate at the polishing pressure was obtained by the above equation. Similarly, a polishing step was performed at the polishing pressure (that is, 5 psi), and a removal rate $R_{Cu}$ of the copper substrate at the polishing pressure was obtained by the above equation. The value of the ratio of the removal rate $R_{PI}$ of the polyimide substrate to the removal rate $R_{Cu}$ of the copper substrate at the polishing pressure of 5 psi ($R_{PI}/R_{Cu}$) was calculated. The value of the ratio of the removal rate ($R_{PI}/R_{Cu}$) can be used to represent the ratio of the removal rate of the resin material (that is, PI) to the removal rate of the metal material (that is, copper) at the particular polishing pressure (that is, 5 psi). As the value of the ratio of the removal rate ($R_{PI}/R_{Cu}$) is larger, the ratio of the removal rate of the resin material to the removal rate of the metal material is larger. The removal rate $R_{PI}$ of the polyimide substrate, the removal rate $R_{Cu}$ of the copper substrate, and/or the value ($R_{PI}/R_{Cu}$) of the ratio of the removal rate $R_{PI}$ of the polyimide substrate to the removal rate $R_{Cu}$ of the copper substrate in each of Examples and Comparative Examples are shown in Table 1.

[Cu Etching Rate]

(Test Conditions)

In Example 1 to 13 and Comparative Example 1 to 9, a silicon wafer (200 mm, blanket wafer) including a copper film having a thickness of 10,000 Å formed on a surface thereof was used as a test piece. Coupons obtained by cutting each of the silicon wafers into chips of 30 mm×30 mm were immersed in 200 ml of each polishing composition under the following conditions.

Immersion time: 10 minutes
Immersion temperature: 60° C.
Stirrer rotation speed: 300 rpm.

(Evaluation of Etching Rate)

The thickness of the copper layer before and after immersion was determined by a sheet resistor (OmniMap RS-100 manufactured by KLA-Tencor Corporation), and (thickness before immersion)−(thickness after immersion) was defined as the etching amount of copper.

The obtained results are shown in Table 1.

As this value is lower, dissolution assumed to occur when the copper layer is polished is suppressed. That is, this can be said to be a preferable result with respect to the suppression of the step difference.

TABLE 1

| | Abrasive grain | | | pH adjusting agent | | Metal polishing accelerator | | Metal anticorrosive | | Oxidizing agent | | Polishing pressure (psi) | Zeta potential (mV) | Removal rate (Å/min) | | Ratio of removal rates | Cu etching rates (Å/min) |
|---|---|---|---|---|---|---|---|---|---|---|---|---|---|---|---|---|---|
| | Kind | Primary particle size (nm) | Content (% by mass) | Component | pH value | Component | Content (% by weight) | Component | Content (% by weight) | Component | Content (% by weight) | | | $R_{Pt}$ | $R_{Cu}$ | $R_{Pt}/R_{Cu}$ | |
| Example 1 | A | 60 | 2 | — | 4.2 | — | — | — | — | — | — | 2.0 | 57.9 | 2867 | — | — | 18 |
| Example 2 | A | 60 | 2 | Hydrochloric acid | 3.0 | — | — | — | — | — | — | 5.0 | 74.2 | 5079 | — | — | — |
| Example 3 | A | 60 | 2 | KOH | 5.0 | — | — | — | — | — | — | 5.0 | 74.0 | 6489 | — | — | — |
| Example 4 | A | 60 | 2 | KOH | 6.0 | — | — | — | — | — | — | 5.0 | 72.9 | 6721 | — | — | — |
| Example 5 | A | 60 | 2 | — | 4.6 | Gly | 0.50 | — | — | $H_2O_2$ | 0.155 | 5.0 | 55.0 | 5733 | 2009 | 2.9 | 296 |
| Example 6 | A | 60 | 2 | — | 4.6 | Gly | 0.50 | — | — | $H_2O_2$ | 0.155 | 5.0 | 55.0 | 6008 | 1721 | 3.5 | 13 |
| Example 7 | A | 60 | 2 | — | 4.6 | Gly | 0.52 | BTA | 0.025 | $H_2O_2$ | 0.155 | 5.0 | 33.0 | 4886 | 5941 | 0.8 | — |
| Example 8 | A | 60 | 2 | Hydrochloric acid | 4.6 | L-His | 0.26 | — | — | $H_2O_2$ | 0.155 | 5.0 | 35.6 | 5246 | 4259 | 1.2 | 318 |
| Example 9 | A | 60 | 2 | Hydrochloric acid | 4.6 | L-His | 0.26 | BTA | 0.013 | $H_2O_2$ | 0.155 | 5.0 | 35.6 | 5447 | 4138 | 1.3 | 70 |
| Example 10 | A | 60 | 2 | Hydrochloric acid | 4.6 | L-His | 0.26 | BTA | 0.025 | $H_2O_2$ | 0.155 | 5.0 | 35.6 | 5315 | 4039 | 1.3 | 30 |
| Example 11 | A | 60 | 2 | Hydrochloric acid | 4.6 | L-His | 0.26 | BTA | 0.050 | $H_2O_2$ | 0.155 | 5.0 | 35.6 | 5344 | 3955 | 1.4 | 15 |
| Example 12 | A | 60 | 1 | Hydrochloric acid | 4.6 | L-His | 0.26 | BTA | 0.050 | $H_2O_2$ | 0.155 | 5.0 | 35.6 | 6306 | 3023 | 2.1 | 15 |
| Example 13 | A | 60 | 2 | KOH | 7.0 | — | — | — | — | — | — | 5.0 | 52.5 | 2341 | — | — | — |
| Comparative Example 1 | A | 60 | 2 | Hydrochloric acid | 2.0 | — | — | — | — | — | — | 5.0 | 43.2 | 30 | — | — | — |
| Comparative Example 2 | A | 60 | 2 | KOH | 8.0 | — | — | — | — | — | — | 5.0 | 24.7 | 118 | — | — | — |
| Comparative Example 3 | B | 30 | 2 | Succinic acid | 4.1 | — | — | — | — | — | — | 2.0 | 16.0 | 13 | — | — | — |
| Comparative Example 4 | C | 30 | 2 | Succinic acid | 4.0 | — | — | — | — | — | — | 2.0 | 64.6 | 1 | — | — | — |
| Comparative Example 5 | D | 30 | 2 | Succinic acid | 4.1 | — | — | — | — | — | — | 2.0 | −66.3 | 29 | — | — | — |
| Comparative Example 6 | E | 60 | 2 | Succinic acid | 4.1 | — | — | — | — | — | — | 2.0 | −21.6 | 29 | — | — | — |
| Comparative Example 7 | F | 60 | 2 | Succinic acid | 4.1 | — | — | — | — | — | — | 2.0 | 51.6 | 35 | — | — | — |
| Comparative Example 8 | G | 60 | 2 | Succinic acid | 4.0 | — | — | — | — | — | — | 2.0 | 57.0 | 553 | — | — | — |
| Comparative Example 9 | H | 60 | 2 | Succinic acid | 4.0 | — | — | — | — | — | — | 2.0 | 55.5 | 658 | — | — | — |

See Example 1 and Comparative Examples 3 to 9 in Table 1. The other experimental conditions of Example 1 and Comparative Example 3 to 9 are the same or similar except that the abrasive grain used in Example 1 is different from the abrasive grains used in Comparative Example 3 to 9. In Example 1, colloidal silica having a surface modified with aluminum ions was used as the abrasive grain (that is, the abrasive grain A), and the removal rate $R_{PI}$ of the polyimide substrate was 2867 Å/min. In contrast, all the abrasive grains (that is, the abrasive grain B to the abrasive grain H) used in Comparative Examples 3 to 9 are different from the abrasive grain according to the present invention. All the removal rates $R_{PI}$ of the polyimide substrates of Comparative Examples 3 to 9 were much lower than the removal rate $R_{PI}$ of the polyimide substrate of Example 1. As can be seen from this, the polishing composition according to the present invention can significantly increase the removal rate of polyimide.

See Examples 2 to 4 and Comparative Examples 1 and 2 in Table 1. The other experimental conditions are the same or similar except that the pH values of the polishing compositions are different. The pH value of the polishing composition in Comparative Example 2 was 8.0, and the removal rate $R_{PI}$ of the polyimide substrate was 118 Å/min. In Comparative Example 1, the pH value of the polishing composition was 2.0, and the removal rate $R_{PI}$ of the polyimide substrate was 286730 Å/min. In Examples 2 to 4, the pH values of the polishing compositions were respectively 3.0, 5.0, and 6.0, and the removal rates $R_{PI}$ of the polyimide substrates were respectively 5079 Å/min, 6489 Å/min, and 6721 Å/min. As can be seen from these, the polishing composition according to the present invention can significantly increase the removal rate of polyimide in a specific pH value range (for example, the pH is more than 2.0 and 7 or less).

See Examples 5 to 12 in Table 1. All the polishing compositions used in Examples 5 to 12 contain the abrasive grain (that is, the abrasive grain A) according to the present invention, the metal polishing accelerator, the oxidizing agent, and the metal anticorrosive (depending on Examples). When the polishing pressure was 5 psi, the values of the ratios of the removal rate $R_{PI}$ of the polyimide substrate to the removal rate $R_{Cu}$ of the copper substrate ($R_{PI}/R_{Cu}$) in Examples 5 to 12 were respectively 2.9, 3.5, 0.8, 1.2, 1.3, 1.3, 1.4, and 2.1. As can be seen from this, when the object to be polished including a patterned structure formed of polyimide and copper is polished by the polishing composition used in each of Examples 5 to 12, the ratio of the removal rate of polyimide to the removal rate of copper can be extremely close to 1.0.

In summary, the polishing composition according to the present invention contains the abrasive grain having a specific structure, and can significantly increase the removal rate of the resin material under the environment of a specific pH value. When the object to be polished including a patterned structure formed of a resin material and a metal material is polished using the polishing composition according to the present invention, the ratio of the removal rate of the resin material to the removal rate of the metal material can be reduced. Therefore, the step difference of the surface of the object to be polished formed by polishing can be effectively reduced. The polishing composition according to the present invention may further contain at least one selected from the group consisting of an oxidizing agent, a metal polishing accelerator, and a metal anticorrosive, and the removal rate of the metal material can be further adjusted to reduce the corrosion of the metal material. When the object to be polished including a patterned structure formed of a resin material and a metal material is polished using such a polishing composition, the step difference formed in the surface of the object to be polished by polishing can be more effectively reduced.

The polishing composition according to the present invention can be used in a chemical mechanical polishing process, and is useful for obtaining a substrate having a flat surface. Therefore, it has industrial applicability.

Although the present invention has been disclosed as above according to some preferable embodiments, these are not intended to limit the present invention, and a person skilled in the art can naturally add any change and modification without departing from the spirit and scope of the present invention. Therefore, the protection scope of the present invention is based on what is defined in the following claims.

The present application is based on Japanese Patent Application No. 2019-061636 filed on Mar. 27, 2019, the disclosure of which is incorporated in its entirety by reference.

REFERENCE SIGNS LIST

102 Colloidal silica particles
104 Aluminum chloride modifier
112 Modified colloidal silica particles

The invention claimed is:

1. A polishing composition comprising:
   abrasive grains containing silica, with at least a part of hydrogen atoms constituting a silanol group located on a surface of the silica being substituted with a cation of at least one metal atom M selected from the group consisting of aluminum, chromium, titanium, zirconium, iron, zinc, tin, scandium, and gallium;
   a metal polishing accelerator comprising an amino acid having 3 or 4 nitrogen atoms and a heterocyclic ring;
   a pH adjusting agent; and
   a dispersing medium,
   wherein a pH of the polishing composition is more than 2 and 7 or less.

2. The polishing composition according to claim 1, wherein the one metal atom M is bonded to one oxygen atom of one silanol group, the one metal atom M is bonded to two oxygen atoms of two silanol groups, or the one metal atom M is bonded to three oxygen atoms of three silanol groups.

3. The polishing composition according to claim 1, wherein a primary particle size of the abrasive grains is 40 to 150 nm.

4. The polishing composition according to claim 1, wherein a content of the abrasive grains is 0.1 to 10% by weight with respect to a total weight of the polishing composition.

5. The polishing composition according to claim 1, further comprising:
   an oxidizing agent having a standard electrode potential of 0.5 V or more; and
   a metal polishing accelerator.

6. The polishing composition according to claim 1, wherein the polishing composition is used for polishing an object to be polished containing a resin.

7. The polishing composition according to claim 6, wherein a melting point of the resin is 200° C. or higher.

8. The polishing composition according to claim 7, wherein the resin has a nitrogen atom.

9. The polishing composition according to claim 1, wherein the pH of the polishing composition is more than 4 and 7 or less.

10. A polishing method comprising a step of polishing an object to be polished using the polishing composition according to claim 1, wherein a surface of the object to be polished includes a patterned structure, and the patterned structure contains a resin.

11. The polishing method according to claim 10, wherein the patterned structure further contains a metal material, and the metal material contains at least one selected from the group consisting of copper, aluminum, cobalt, tungsten, and combinations thereof.

12. The polishing method according to claim 11, wherein when a removal rate of the polishing composition with respect to the resin at a polishing pressure of 5 psi is defined as a first removal rate R1 and a removal rate of the polishing composition with respect to the metal material at a polishing pressure of 5 psi is defined as a second removal rate R2, a value of a ratio of the first removal rate to the second removal rate R1/R2 is 0.5 to 6.0.

13. A method for producing a substrate, the method comprising the steps of:
　preparing a substrate; and
　polishing the substrate using the polishing composition according to claim 1,
　　wherein a surface of the substrate includes a pattern structure, and the pattern structure contains a resin and a metal material.

\* \* \* \* \*